United States Patent
Laumen et al.

(10) Patent No.: US 7,162,677 B1
(45) Date of Patent: Jan. 9, 2007

(54) DEVICE AND METHOD FOR CODING DATA WITH A FIRE CODE

(75) Inventors: Josef Laumen, Hildesheim (DE); Wael Adi, Braunschweig (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/623,946

(22) PCT Filed: Aug. 27, 1999

(86) PCT No.: PCT/DE99/02686

§ 371 (c)(1),
(2), (4) Date: Nov. 3, 2000

(87) PCT Pub. No.: WO00/22737

PCT Pub. Date: Apr. 20, 2000

(30) Foreign Application Priority Data

Oct. 13, 1998 (DE) .................. 198 46 723

(51) Int. Cl.
*H03M 13/00* (2006.01)
(52) U.S. Cl. .................. 714/758; 714/774
(58) Field of Classification Search ........ 714/781, 714/762, 758, 764, 774, 7, 746, 761, 788; 371/39.1, 40, 38; 341/95
See application file for complete search history.

(56) References Cited

U.S. PATENT DOCUMENTS 4,486,881 A * 12/1984 de Couasnon .......... 714/758
4,677,623 A * 6/1987 Iwasaki et al. ......... 714/762
5,148,432 A * 9/1992 Gordon et al. ......... 714/7
5,381,423 A * 1/1995 Turco .................. 714/762
5,699,369 A * 12/1997 Guha .................. 714/774
5,936,978 A * 8/1999 Ramesh et al. ........ 714/762

FOREIGN PATENT DOCUMENTS

DE 30 32 468 C2 1/1986

OTHER PUBLICATIONS

Stephen B. Wicker, "Error Control Systems" Prentice Hall (pp. 437-440).*
Aurer B: A Modified Decoding Algorithm for the Fire Code With Fast Burst Error Correcting ITI 1994, Processings of the 16th International Conference on Information Technology Interfaces, University of Zagreb, Comput. Center Jun. 14-17, 1994, pp. 355-360.

* cited by examiner

*Primary Examiner*—Guy Lamarre
*Assistant Examiner*—Mujtaba K. Chaudry
(74) *Attorney, Agent, or Firm*—Michael J. Striker

(57) ABSTRACT

In a method and apparatus for encoding or decoding data, a fire code is used for this with a polynomial $G(x)=P(x)(1+x^C)$, wherein the value for C can be variably selected, and in addition, the error correction and detection properties of the redundancy integrated into the decoding apparatus can be set independently of the encoding device, and these properties depend solely on the number of redundancy bits used.

6 Claims, 4 Drawing Sheets

DEVICE AND METHOD FOR CODING DATA WITH A FIRE CODE

BACKGROUND OF THE INVENTION

The invention is based on an apparatus and a method for encoding and decoding data according to the preamble to the independent claim. German patent document DE 30 32 468 has already disclosed encoding methods and apparatuses which use a so-called fire code. For a code of this kind, a generator polynomial in the form $G(x)=P(x)(1+x^C)$ is used, where $P(x)$ is a so-called irreducible polynomial of the degree m, the use of such a fire code permits a simple recognition and correction of errors in the decoding.

SUMMARY OF THE INVENTION

The method and apparatus for encoding and decoding according to the invention can be used to change the redundancy of the code in a simple manner. A variable redundancy code (VRC) of this kind can be used for the adaptation of data rates.

In the decoding, it is advantageous to concentrate on error recognition or error correction.

DESCRIPTION OF THE PREFERRED EMBODIMENTS

Figure 1:
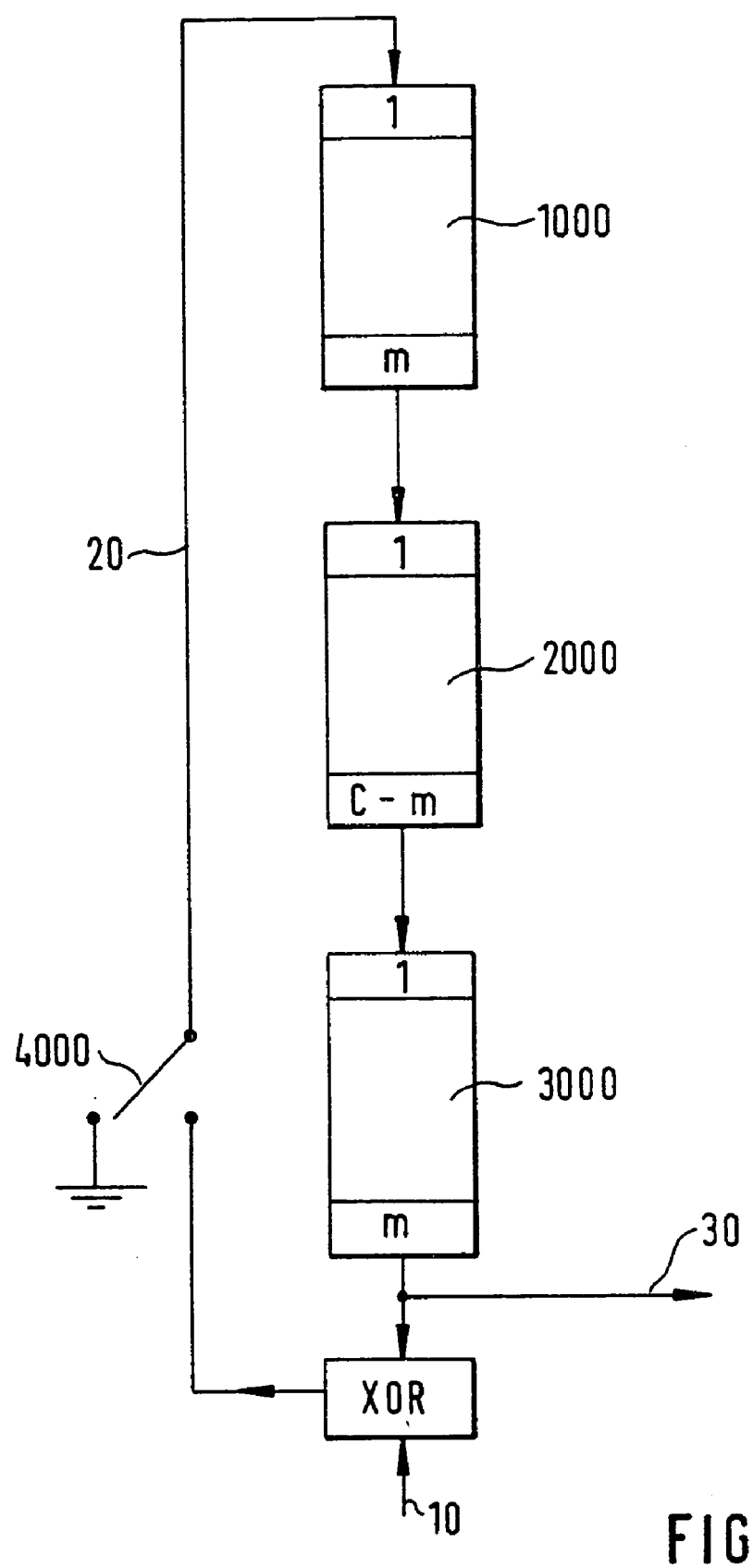
FIG. 1 is a general block circuit diagram of an encoding apparatus that operates in accordance with the fire code.

The encoding apparatus according to the invention is schematically depicted in FIG. 1. The entire apparatus according to FIG. 1 is used for encoding in accordance with a fire code. The encoder has a first partial encoder (1000), which receives the data (20) and encodes it by means of an irreducible polynomial $P(x)$. The data (20) were generated by means of a modulo (2) connection of the input (10) with the output of the partial decoder (3000).

The encoder has a second partial encoder (3000), which also receives the data (20) and encodes them in accordance with $x^C \cdot P(x)$. Between these two partial encoders, there is an apparatus (2000) for producing a variable redundancy. The data encoded in this manner are then read at the output (30). During the first k cycles, i.e. during the time in which the k input bits are read by (10), the switch (4000) is disposed in the closed position shown. For the subsequent reading of the redundancy (r bits) at the output (30), the switch (4000) is opened for the duration of r cycles.

Consequently, the two partial encoders (1000) and (3000) and the apparatus (2000) produce a generator polynomial $G(x)=P(x)(1+x^C)$ for the encoding.

Figure 2:
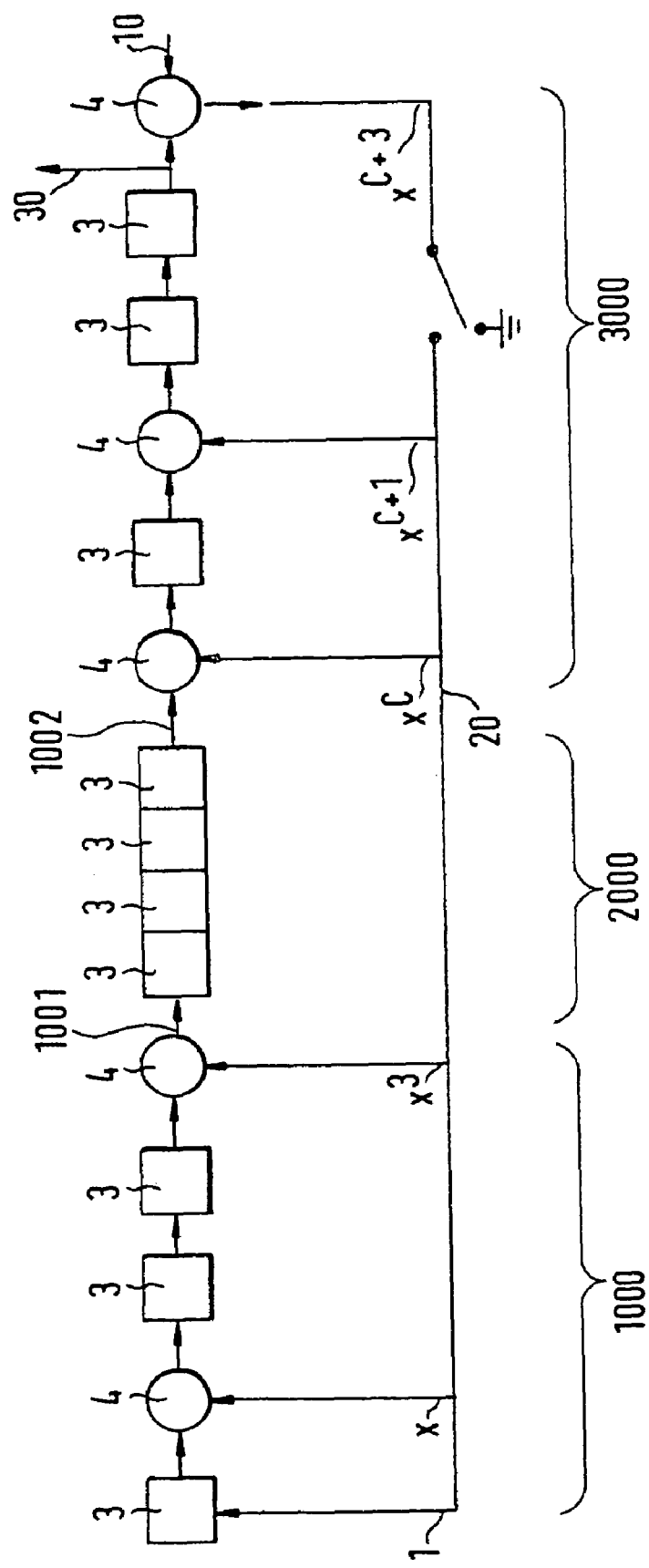
FIG. 2 shows an encoding apparatus in the example of the polynomial $P(x)=1+x+x^3$.

FIG. 2 shows an example for the encoder according to FIG. 1. By way of example, a polynomial $P(x)=1+x+x^3$ is produced here. Polynomials generally have the form $P(x) =1+a_1x+a_2x^2+ \ldots +a_m x^m$, where a can assume the value 0 or 1. In the current example $P(x)=1+x+x^3$, the partial encoder (1000) is comprised of three storage elements of a disk register which are disposed in sequence. The bits at the input (10) are first modulo (2) connected to the output of the partial encoder (3000). The data (20) thus obtained are moved in sequence through the storage elements (3). After the first storage element (3) and the third storage element (3), respective modulo (2) adders (4) are provided, which are embodied as XOR elements. Both modulo (2) adders (4) are likewise impinged on by the data (20). The output (1001) of this partial encoder is connected to the input of the subsequent partial apparatus (2000), which is depicted in detail in FIG. 3. The output (1002) of the partial apparatus (2000) is connected to the subsequent partial encoder (3000) which is embodied analogously to the partial encoder (1000).

Figure 3:
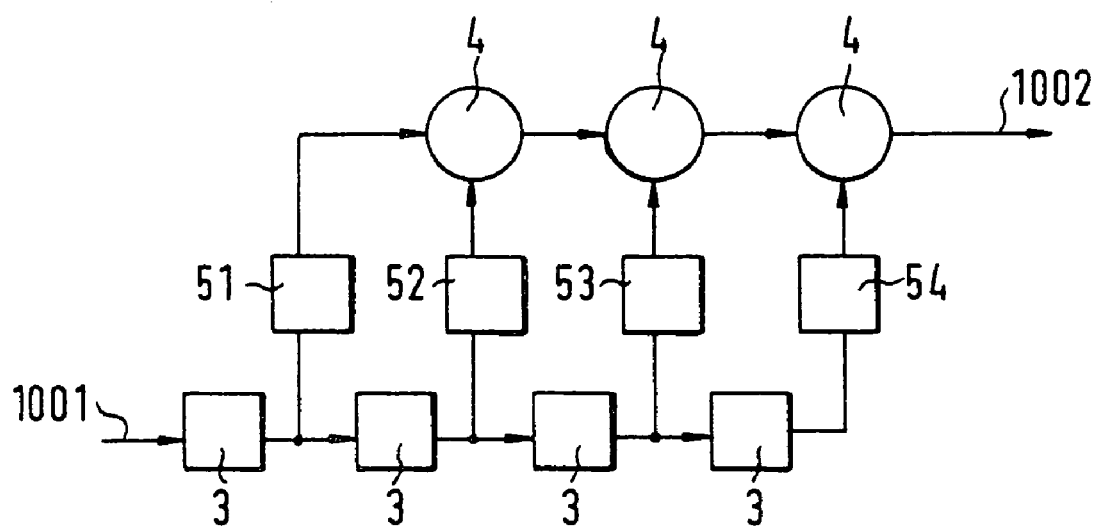
FIG. 3 shows a partial apparatus from FIGS. 1 and 2 for producing variable redundancy.

FIG. 3 depicts the partial apparatus (2000) for producing variable redundancy. FIG. 3 depicts a disk register comprised of four memory elements 3 disposed in series (generally c–m, as shown in FIG. 1). A pick-up is disposed after each of these memory elements and is connected to inputs of modulo (2) adders (4) via switches (51), (52), (53), (54). Both inputs of these modulo (2) adders (4) are connected to two of the switches (51), (52), (53), (54), an arbitrary connection of the pick-up points between the individual storage places of the disk register can now be produced among the modulo (2) adders (4). By closing the switches (51), (52), (53), or (54), different generator polynomials of the entire encoder according to FIGS. 1 and 2 can now be produced. Since the intent here is to produce a polynomial in the form $(1+x^C)*P(x)$, only one of the switches (51), (52), (53), (54) is respectively closed (i.e. the connection is produced), whereas all of the other switches are open (i.e. the connection is broken). Closing the switch (51) in connection with the irreducible polynomial selected in FIG. 2, for example, produces a generator polynomial of the encoder in the form $(1+x^4)*(1+x+x^3)$, closing the switch (52) produces a polynomial in the form $(1+x^5)*(1+x+))$, closing the switch (53) produces a polynomial in the form $(1+x^6*(1+x+x^3)$, and closing the switch (54) produces a polynomial in the form $(1+x^7)*(1+x+x^3))$. The apparatus shown is therefore in a position to provide the entire encoding with various multiple redundancies depending on the position of the switches (51), (52), (53), (54).

The apparatus shown in FIGS. 1 to 3 is consequently in a position to use various multiple redundancies in the encoding of data. By actuating the switches, additional redundancy between one and four bits can be variably produced. An encoder of this kind can consequently be used to variably establish the redundancy so the reference is also made below to a VRC (variable redundancy encoder). VRCs of this kind can advantageously be used to adapt the redundancy to a data channel. This is primarily of interest when only fixed values for the data rate are possible for the transmission channel, but the data rate of the source data varies. The transmission reliability can be increased in a particularly simple manner by adding additional redundancy bits.

The method and apparatus for encoding with variable redundancy as has been described in conjunction with FIGS. 1 to 3 is particularly suitable when used in combination with a decoding apparatus or decoding method according to DE 30 32 468. Therefore in FIG. 4, the decoder according to FIG. 1 of DE 30 32 468 is shown once again as an overview diagram in FIG. 4. The data are transmitted to an output (100) and are then evaluated in a number of registers (101), (102), (103), (104) in series. The registers (101) and (104) are conventional decoding apparatuses that are designed to decode in accordance with the polynomial $P(x)$. The disk register (102) has b storage places and the disk register (103) has C-m-b storage places. C stands for the power of the polynomial $1+x^3$ and m is the degree of the polynomial $P(x)$.

Only values of c that are greater than the value of m have practical relevance for correcting codes. The number b is a selectable value which predetermines how many errors should be able to be corrected. In all cases, the number b is less than the minimum of the numbers m and (c+1)/2. The registers (102) and (103) are now embodied in such a way that disk registers of variable length can be produced by means of switches, as has already been described in conjunction with FIG. 3. Consequently, depending on the present parameters, the length of the register (102) and the length of the register (103) can be freely set. This measure consequently permits the decoding of the encoded data to be variably implemented. The value of C is set as a function of which value has been selected for C in the encoding. Furthermore, the user also has the option of deciding whether it is more important to correct data errors or to detect data errors The values b and d are selected as a function of this.

As has already been described in DE 30 32 468, the data is supplied to the input (100) until the same the pattern is present in the registers (101) and (104). This is determined by the comparator (105). If in addition, only zeros are contained in the third register (103), then the desired error pattern is present in the second register (102). The requirement that all register places in the register (103) contain a zero is determined by the NOR element (106) and only then is an "error trapped" signal emitted at the output (107) if the AND element 108 receives a signal from both the NOR element (106) and the comparator (105). As has already been described in DE 30 32 468, the error pattern that is then contained in the register (102) is transformed via the encoding stage (109) into a vector with m bits end is multiplied in the multiplication stage (110) by the corresponding values of the register (104). The logic circuit (111) can then use the result of the multiplication stage (110), as has already been described in DE 30 32 468, to determine which bits are erroneous.

One example: a fire code is used as a VRC code, which has the capacity to correct bundle errors. Let this fire code be defined according to DE 30 32 468 as $G(x)=(1+x^c)*P(x)$, with e, $e=2^m-1$, of the period of the irreducible polynomial $P(x)$ of the grade m. The period of the polynomial $P(x)$, in connection with c, determines the length of the code selected, i.e. the length of a VRC-encoded data packet is maximally limited to $n=k+r=KGV\{e,c\}$, where $KGV\{a,b\}$ represents the smallest common multiple of a and b.

Let the level of the redundancy incorporated by means of this fire code b $r=c+m$ [bits]. The value c should then fulfill the condition $c=2*b-1$, where b represents the length of a bundle error, which can still be corrected with the aid of this code and maximally can assume the value m (i.e. b=m). If this block code is then distributed over v data frames with the aid of an interleaver, then its correction capacity is improved by the factor v to $b'=b*v$, i.e. if a single burst error with a maximal length of $b'=b*v$ occurs in the v data frames, then these v data frames are correctly reconstructed.

In order to always assure a meaningful maximal error detection, however, a comprise must be struck between error detection and error correction; typically small values are selected for b. Because with d, the length of a detectable error bundle of a data frame and with b, the length of the correctable bundle error, the follow equation applies: $d=c+1-b$. that is, in the transmission of a data frame, if a single bundle error occurs in the data frame, if a single bundle error occurs in this frame, then the decoder can fully correct this bundle error provided that the length of the bundle error does not exceed the value of b [bits]. If the length of the bundle error exceeds the value of b, then it can in fact no longer be corrected; the decoding apparatus, however, still detects this bundle error—provided that the burst is not longer than the value of d. However, if a bundle error occurs with a length of that is greater than d, then it is possible that the decoder may no longer be able to detect his error and may possibly correct it erroneously. That is, the decoder "believes" that it has correctly reconstructed the data frame although this data frame is still erroneous.

By means of an interleaver the functions with v data frames, the capacity of the decoder to detect bundle errors can also be improved by the factor v to $d'=d*v$; i.e. if a single, interrelated burst error with the maximal length $d'=d*v$ occurs in the v data frames, then this burst error is still detected by the code.

Figure 4:
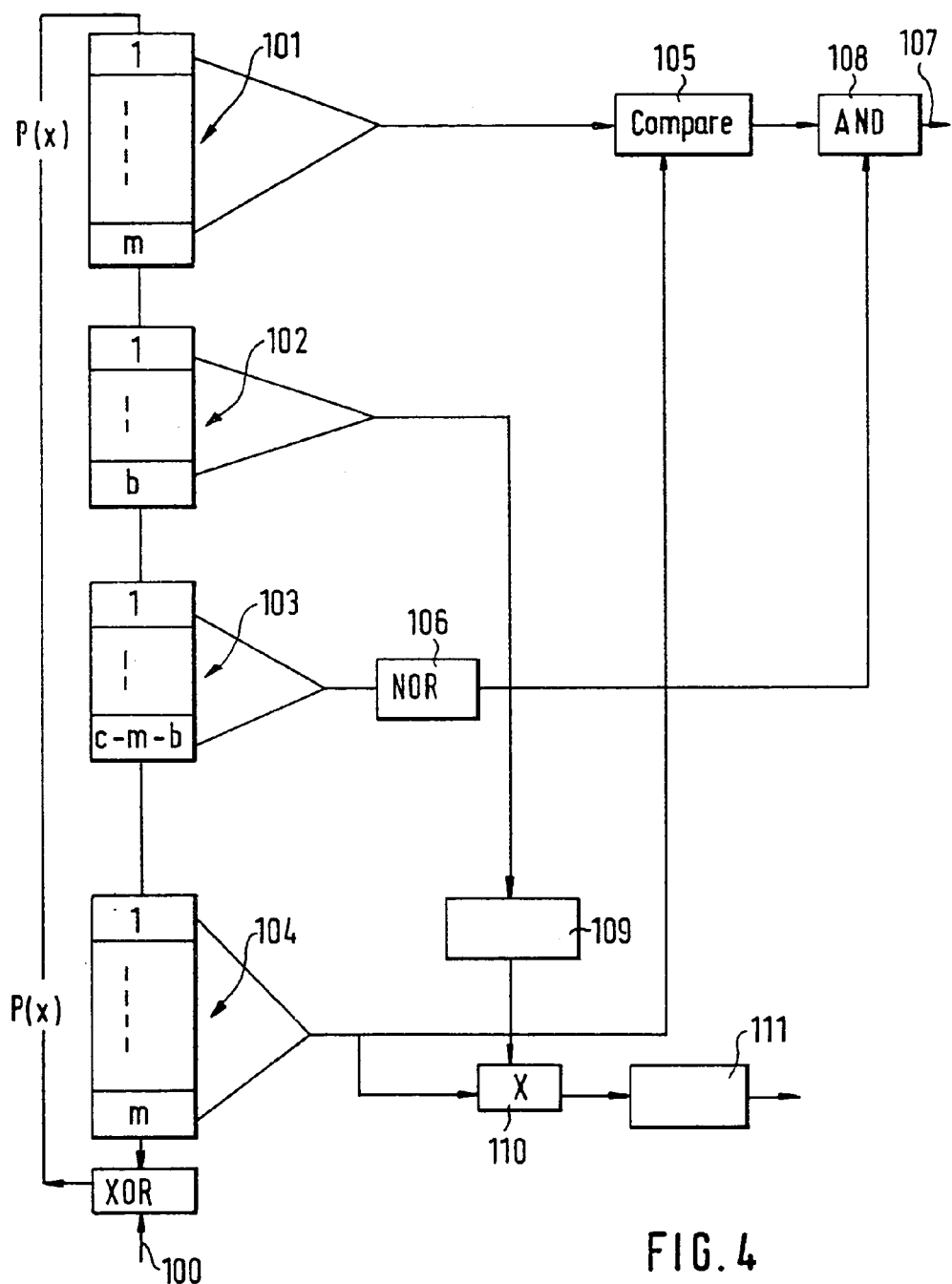
FIG. 4 shows a decoding apparatus.

FIG. 4 shows an example for an implementation of a VRC code by means of fire code. First, the irreducible polynomial $P(x)$ is selected. In this case, the following polynomial of the length m=16 [bits] is selected: $P(x) = 111000000100000011 = 1+x+x\ 8+x\ 15+x\ 16$, with m=16, period $e=257=2^8+1$.

This yields a maximal code length of $KGV\{e,c\}=257*c$ [bits], depending on the setting for c. The value for c is produced bidirectly from the known block length k of the data stream to be encoded and the likewise predetermined block length n of the VRC-encoded data on the physical channel. The equation n=k+r, the redundancy r=c+m, and the fixed value m=16 yield the equation c=r−m=n−k−m.

The properties of the (bundle) error connection and the (bundle) error detection can now be matched to each other. Error correction can be selected between b=0 and b=min {m, (c+1)/2}, where the select of b has a direct influence on the detection capacities of the VRC code due to the equation d=c+1−b. A comprise is necessary.

Example: let the values k=280, the length of a source data frame, n=320, the required number of bits per data frame after the VRC encoding, and m=16 be predetermined with $P(x)$ as above.

The redundancy to be produced consequently yields r=n−k=320−280=40. With m=16, c then becomes c=24. The correction capacity of the code should be limited to b=3 [bits] in order to thus assure a relatively high error correction of d=c+1−b=24+1−3=22 [bits]. This means that a bundle error up to a length of 22 bits will not be erroneously corrected by the decoder, but will be detected as an error. In such an instance, either the decoding process will be interrupted by an error message or the decoded bit stream will be marked as erroneous. However, if a bundle error of at least 3 bits in length occurs in a data frame with a length n=320, then this bundle error can be completely corrected; the source bit stream is reconstructed in an error-free manner.

The implementation of this flexible code, whose properties can be dynamically adapted to the external conditions, does not require any special alterations in the architecture of the decoder according to FIG. 4 or according to DE 30 32 468. Changing the two parameters c and b merely results in the fact that the registers (102) and (103) of the decoder must be designed with a variable (logical) length. In addition, the extreme values of c and b determine the width of the NOR gate (106) and the encoding stage (109) shown in FIG. 4.

The example mentioned above considers a code with c=14. This means that the unabbreviated code length, i.e. the maximal permissible number of bits n in a valid code word, is $nmax=(k+r)max=e*c=KGV\{257,24\}=6168$ [bits]. However, the code was produced as an abbreviated code with n=320. Abbreviated code in general and very abbreviated codes in particular have the property that their error protection characteristics d'>d and b'>b are in part considerably better than the properties (d and b) of the unabbreviated mother code. A quantitative conclusion as to the improvement, however, can only be determined by experiment.

The invention claimed is:

1. An apparatus for encoding data in accordance with a fire code $G(x)=P(x)(1+x^C)$, where $P(x)$ is an irreducible polynomial of the degree m, wherein the value for C can be freely set within predetermined limits and changed so that a code with variable redundancy can be obtained, the apparatus is formed so that it can implement a plurality of different fire codes, the different fire codes are selected for coding of input data in dependence on a control value, to produce the code with variable redundancy, and the variable redundancy produced by the fire code is used to dynamically adapt a data rate of a source data to an available band width of a respective data channel, when the data rate of the source data varies and for the data channel only fixed rates for data rate are possible, by adding additional redundancy bits, the upper limit for C is predetermined by a maximal value and that the encoding apparatus has storage elements and modulo 2 adders whose number corresponds to a maximal number, and that switches are provided, by means of which the storage places and modulo 2 adders can connected together into an encoder according to the selected value C.

2. An apparatus as defined in claim 1, wherein values b and d for the error correction and detection properties of the incorporated redundancy are adapted to the respective quality of the transmission value, and the values b and d are adapted to a bit error rate of the transmission channel.

3. A decoder for decoding data in accordance with a fire code $G(x)=P(x)(1+x^C)$, where $P(x)$ is an irreducible polynomial of the degree m, wherein the value for C can be freely set within predetermined limits, wherein the length of a disk register can be set as a function of the value for C, and wherein a second disk register is provided, whose length can be set to a value B, where in all cases, B is less than m and where B indicates the maximal number of correctable bit errors.

4. A method for encoding data in accordance with a fire code $G(x)=P(x)(1+x^C)$, where $P(x)$ is an irreducible polynomial of the degree m, wherein the value for C can be freely set within predetermined limits and changed so that a code with variable redundancy can be obtained, and the variable redundancy produced by the fire code is used to dynamically adapt a data rate of a source data to an available band width of a respective data channel so that with only fixed values for a data rate for the transmission channel and variable data rate of a source, transmission reliability can be increased by selecting coding and corresponding polynomials in dependence on different situation, wherein values b and d for the error correction and detection properties of the incorporated redundancy are adapted to the respective quality of the transmission value, and the values b and d are adapted to a bit error rate of the transmission channel.

5. A method for decoding data in accordance with a fire code $G(x)=P(x)(1+x^C)$, where $P(x)$ is an irreducible polynomial of the degree m, wherein the value for C can be freely set within predetermined limits and changed so that a code with variable redundancy can be obtained, and the variable redundancy produced by the fire code is used to dynamically adapt a data rate of a source data to an available band width of a respective data channel so that with only fixed values for a data rate for the transmission channel and variable data rate of a source, transmission reliability can be increased by selecting codings and corresponding polynomials independence on different situation, and wherein the values b and d for the error correction and detection properties of the incorporated redundancy can be freely set within predetermined limits and in accordance with d=c+1−b.

6. A method as defined in claim 5, wherein values b and d for the error correction and detection properties of the incorporated redundancy are adapted to the respective quality of the transmission value, and the values b and d are adapted to a bit error rate of the transmission channel.

* * * * *